United States Patent [19]

Corbett

[11] Patent Number: 4,461,569

[45] Date of Patent: Jul. 24, 1984

[54] CONCENTRICITY GAGE

[75] Inventor: James O. Corbett, Eustis, Fla.

[73] Assignee: The Electron Machine Corporation, Umatilla, Fla.

[21] Appl. No.: 337,621

[22] Filed: Jan. 7, 1982

[51] Int. Cl.³ .............. G01N 21/89; G01R 27/26; B29F 3/10

[52] U.S. Cl. .............. 356/72; 324/61 R; 356/237; 425/169

[58] Field of Search .............. 356/72, 385, 386, 237; 425/169; 324/61 R

[56] References Cited

U.S. PATENT DOCUMENTS

| 3,748,577 | 7/1973 | Jones, Jr. | 324/61 R |
| 4,086,044 | 4/1978 | Sikora | 425/169 X |
| 4,086,528 | 4/1978 | Walton | 324/61 R |
| 4,395,119 | 7/1983 | Nakata et al. | 356/237 X |

FOREIGN PATENT DOCUMENTS

| 724849 | 1/1966 | Canada | 356/386 |
| 894573 | 4/1962 | United Kingdom | 356/386 |

Primary Examiner—Vincent P. McGraw
Attorney, Agent, or Firm—Kemon & Estabrook

[57] ABSTRACT

A non-contact measuring apparatus for determining errors in concentricity between an elongated electrically conductive core such as a wire and an insulation coating thereon is disclosed. An optical scanning section produces an electrical signal proportional to the position of the coating at the same time that a capacitance section produces an electrical signal proportional to the position of the core. A comparator compares the two signals to yield a difference or error signal proportional to the error of concentricity and the result is continuously displayed to show the axis and magnitude of the error.

3 Claims, 4 Drawing Figures

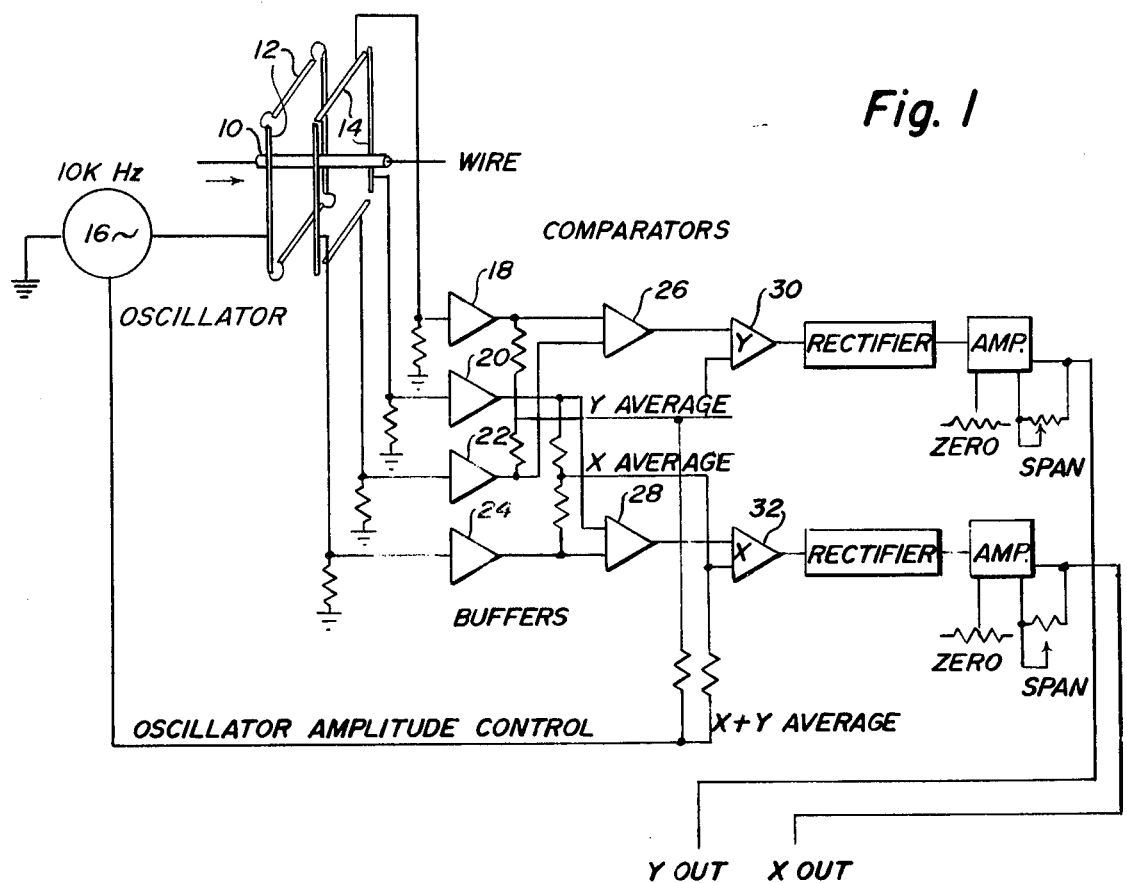

CONCENTRICITY GAGE

BACKGROUND OF THE INVENTION

In the manufacture of insulated wire, a resin coating is usually extruded around the wire in an extrusion head and the coated wire is thereafter quenched to set the coating. Many uses require uniform concentricity between such wire and coatings and it is therefore desirable to have a measuring means positioned downstream of the extruder head but upstream of the quenching bath to continuously indicate errors in concentricity. In this way, the extrusion apparatus may be adjusted to produce a uniform product. Because the coating is still somewhat soft as it leaves the extruder head, the measuring means should be of a non-contact type. One prior art example of a non-contact eccentricity gage may be found in U.S. Pat. No. 4,086,044.

BRIEF SUMMARY OF THE INVENTION

In accordance with the present invention, a measuring head houses an optical scanning section and a capacitance section and the coated wire from the extruder head passes in non-contacting relation through both. The optical scanning section produces a first electrical signal which is proportional to the position of the coating and the capacitance section produces a second sinal proportional to the position of the core. These two signals are compared to produce a difference signal, the magnitude of which is proportional to the degree of eccentricity and the result in continuously displayed on a readout device which shows the magnitude and axis of the eccentricity.

BRIEF DESCRIPTION OF THE DRAWINGS

FIG. 1 is a diagrammatic showing of the capacitance section;

FIG. 2 is a diagrammatic showing of the optical scanning section;

DETAILED DESCRIPTION OF THE DRAWINGS

Figure 3:
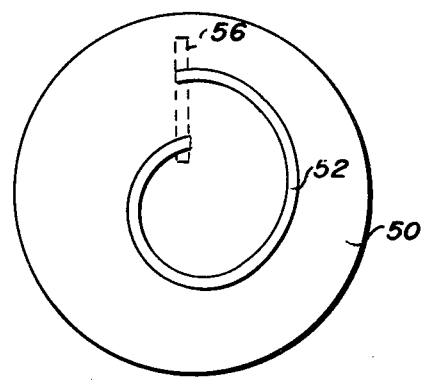
FIG. 3 is a diagram of one of the scanners.

Referring first to FIG. 1, an insulated wire 10 fresh from the extruder head is advanced through four symmetrically arranged driver plates 12 and then through a plurality of sensing plates 14 arranged in the same configuration as the driver plates and spaced therefrom preferably in the direction of travel of the wire. The driver plates 12 are connected to an oscillator 16 which by way of example may have a frequency of 10 KHz. Those sensor plates 14 which are vertically positioned will be presumed to provide a horizontal or X-signal while those which are horizontally positioned will be presumed to provide a vertical or Y-signal. Each plate is individually connected to its own buffer amplifier 18, 20, 22 or 24. The outputs of buffers 18 and 22 are compared in a comparator 26 while the outputs of buffers 20 and 24 are compared in a comparator 28. Then the difference between the two representated by the outputs of the comparators 26 and 28 are additionally compared with the average of the two sets of buffers in further comparators 30 and 32. The outputs of comparators 30 and 32 are rectified and the resulting signals are used to determine the position of the conductor.

Referring now to FIGS. 2 and 3 for a description of the optics section of the measuring head, a pair of motor driven scanning discs 50 are positioned at right angles to each other. Each disc as shown in FIG. 3 is opaque except for a transparent spiral 52. By positioning a further opaque member 54 between each scanning disc and the wire and positioning a slit aperture 56 in the members 54, rotation of the discs when illuminated from the side remote from the wire results in a portion of the scanning beam passing through the air space occupied by the wire to be measured. Positioned on opposite sides of the wire 10 from the discs 50 are solar cells 58, the illumination of which at any point in time is dependent on the position of each scanning beam in relation to the wire 10. At the beginning and end of each scan, both ends of the scanner spiral are present in the aperture area simultaneously. Therefore, twice as much light reaches the solar cells 58 as would during any other period of the scan except when the light path is blocked by the wire when no light reaches the cells. As each scanner revolves, the transmitted light beam moves toward the scanners center. During the time that the wire blocks the scan beam, the output of the cells will be proportionally low and time intervals between maximum and minimum illumination we can designate as A and B. If the wire moves up in the beam, A will decrease in time and B will increase. Conversely as the wire moves down in the beam, A will increase and B will decrease. By translating the times represented by A and B to voltages and comparing these voltages to each other, the voltage difference can be used, with additional electrical manipulation, to indicate the position of the wire insulation.

Figure 4:
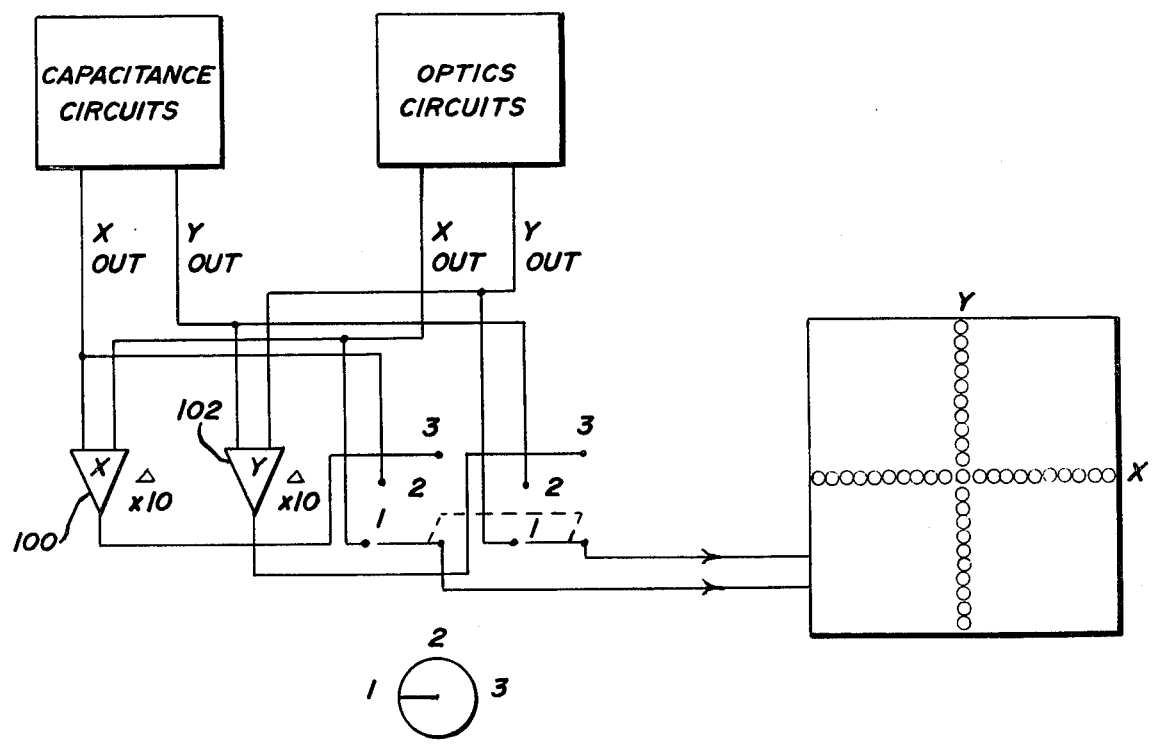
FIG. 4 is a diagrammatic showing of the signal comparison and readout display.

Referring now to FIG. 4, the X and Y axis signals from the capacitance and optics sections are adjusted to precisely track each other over a given range of wire movement. Only when the conductor or the insulation moves independently of the other creating different centers, does a difference in the outputs occur. Any voltage difference between the optics output and the capacitance output signals is a measurement of error of concentricity. Such error signal is amplified in amplifiers 100 and 102 respectively and then connected to a light emitting diode display. As indicated in FIG. 4, the display consists of four rows of ten light emitting diodes each, radiating from a common center at 90°, the vertical rows representing the Y-axis and the horizontal rows the Y-axis. Each illuminated light emitting diode departing from the center additively reflects the displacement of the conductor from the center of the insulation.

While a preferred embodiment of the present invention has been herein disclosed, applicant claims the benefit of a full range of equivalents within the scope of the appended claims.

I claim:

1. A non-contact gage for continuously indicating concentricity errors between an unexposed elongated electrically conductive core member having an insulation coating thereon as said member passes through said gage comprising:

optical scanning means for generating a first electrical signal, the magnitude of which is proportional to the position of the insulation coating;

capacitive means for simultaneously generating a second electrical signal, the magnitude of which is proportional to the position of said unexposed conductive core; and means for comparing said signals to yield a difference signal proportional to any error of concentricity between said core and coating.

2. A non-contact gage as defined by claim 1 in which said optical scanning means includes a pair of optical scanners at right angles to each other and a pair of sensors one associated with each scanner respectively.

3. A non-contact gage as defined by claim 2 in which said capacitive means includes four driven plates arranged symmetrically around an axis along which the member to be gaged is passed, and four sensing plates of the same geometry as said driven plates also arranged about said axis and spaced axially from said driven plates;

means for supplying said driven plates with an alternating voltage; and means connected to said sensing plates for providing an output voltage proportional to the position of the unexposed core of the member being gaged.

* * * * *